United States Patent [19]

Nakanishi et al.

[11] Patent Number: 5,072,125
[45] Date of Patent: Dec. 10, 1991

[54] ION IMPLANTER

[75] Inventors: Koichiro Nakanishi; Haruhisa Fujii; Hirotaka Muto, all of Hyogo, Japan

[73] Assignee: Mitsubishi Denki Kabushiki Kaisha, Tokyo, Japan

[21] Appl. No.: 592,659

[22] Filed: Oct. 4, 1990

[30] Foreign Application Priority Data

Oct. 5, 1989 [JP] Japan .................................. 1-260640
Sep. 26, 1990 [JP] Japan .................................. 2-258318

[51] Int. Cl.$^5$ ............................................. H01J 37/00
[52] U.S. Cl. ............................. 250/492.2; 250/492.3; 250/398
[58] Field of Search ............... 250/492.2, 492.21, 398, 250/492.3

[56] References Cited

U.S. PATENT DOCUMENTS 4,011,449  3/1977  Ko et al. ........................ 250/492.21
4,135,097  1/1979  Fomeris et al. ..................... 250/398
4,775,796  10/1988  Purser et al. .................... 250/492.21

OTHER PUBLICATIONS

McKenna et al., "Wafer Charging . . . Current Implanter", Nuclear Instruments . . . , B37/38 (1989) pp. 492-496.

Primary Examiner—Jack I. Berman
Assistant Examiner—Kiet T. Nguyen
Attorney, Agent, or Firm—Leydig, Voit & Mayer

[57] ABSTRACT

An ion implanter has a sample table on which a sample is placed, and means for injecting ions into the sample by applying an ion beam to the sample on the sample table. The ion implanter has magnetic field applying means for generating radial magnetic fields on the surface of the sample from near the center of the sample to outside of the outer periphery of the sample. The secondary electrons generated when the ion beam irradiates the sample table or the sample, including the secondary electrons generated from the sample table near the outer periphery of the sample, are trapped in the magnetic fields and transferred to the central portion of the sample. The secondary electrons are attracted by the electrostatic charge of the ions injected to the surface of the sample and recombine with the ions. Consequently the electrostatic charge on the surface of the sample is decreased, preventing generation of device defects caused by electrostatic discharge damage.

8 Claims, 6 Drawing Sheets

ION IMPLANTER

BACKGROUND OF THE INVENTION

1. Field of the Invention

The present invention relates to an ion implanter, and more specifically, to an ion injecting apparatus having means for generating a magnetic field for trapping secondary electrons generated when an ion beam irradiates a sample table or a sample.

2. Description of the Background Art

A conventional ion implanter will be described in the following with reference to FIGS. 1, 2, 3A and 3B.

FIG. 1 shows a sectional structure near a sample table of an ion implanter of Varian Associates disclosed in, for example, "Nuclear Instrument and Method in Physics Research B37/38 (1989), p492–p496". Referring to the figure, a sample 2 is held on a sample table 1 formed of aluminum or the like. A secondary electron trapping electrode 3 is arranged opposing the sample 2, for trapping secondary electrons generated when an ion beam (the arrow $I_B$ shown in FIG. 1) irradiates the sample table 1 or the sample 2. Negative potential electrodes 4 and 5 are arranged adjacent to the secondary electron trapping electrode 3 for trapping electrons therearound, and a beam stopper 6 for controlling the ion beam flow to the sample 2 is arranged between the negative potential electrodes 4 and 5. Not only the sample table 1 but the secondary electron trapping electrode 3, the negative potential electrodes 4 and 5 and the beam stopper 6 are formed of conductive materials such as aluminum.

The operation of the conventional ion implanter structured as above will be described. When the beam stopper 6 is set to "open", the ion beam irradiates the sample 2 which has been conveyed and placed on the sample table 1. The ion implanter is used in, for example, a process for forming a MOS transistor shown in a schematic cross sectional view of FIG. 2. Referring to FIG. 2, when a p type field layer 11 or a channel 12 is to be formed, for example, boron ions B+ are injected. When a source 13 or a drain 14 is to be formed, phosphorus ions (P+) or arsenic ions (As+) are injected. In either case, ions having positive charges are implanted in to the sample 2, and therefore the sample is positively charged if there is an insulating material of high resistance such as a resist 15 or a silicon oxide film on the surface of the wafer. When ions are implanted, secondary electrons incidental to the ion implantation are generated from the sample table 1 or from the sample 2. In such a conventional ion implanter, most of the secondary electrons generated from the sample table 1 or the sample 2 are trapped by the secondary electron trapping electrode 3. Further, most of the secondary electrons in the direction of the sample 2 (toward the right in FIG. 1) recombine with ions around the sample 2, and therefore few secondary electrons reach the central portion of the sample 2. Consequently, the electrostatic charge on the surface of the sample 2 becomes high, which causes electrostatic discharge damage, which is the cause of device defects generated at the central portion of the sample 2.

In order to solve part of the problem of the above described conventional ion implanter, an ion implanter neutralizing the positive ions with negative electrons such as shown in FIGS. 3A and 3B has been proposed in Japanese Published Patent Application 1-232653. Referring to FIGS. 3A and 3B, in the ion injecting apparatus disclosed in this publication, an ion beam 21 of positive ions 21a such as B+, As+, P+ and or Sb+ together with electrons 22 trapped by the ion beam 21 are applied to the wafer 23 to carry out ion implantation. The characteristic of this apparatus lies in the provision of a magnetic field generating source formed of, for example, 6 bar magnets 26 on a holder 25 of a wafer disk 24. The magnetic field generating source forms magnetic lines of force 27 on the surface 23a of the wafer 23. These magnets 26 are embedded radially in the holder 25 with the N pole of each of the magnets facing each other approximately at the center of the holder 25, and the S poles positioned on the outer periphery of the holder 25.

Since the magnets 26 are provided in the above described manner, magnetic lines of force 27 extending from the center of the wafer 23 to the outer periphery thereof are formed on the wafer surface 23a. The positive ions 21a reaching the wafer 23 enter the wafer 23, and at this time, positive charges 28 remain on the surface 23a of the wafer. Meanwhile, the electrons 22a reaching the wafer 23 with the positive ion 21a move on the wafer surface 23a. However, since magnetic lines of force 27 are formed on the wafer surface 23a, the electrons 22a move in a direction crossing the magnetic lines of force 27 in a cycloid movement in right-handed or left-handed rotation corresponding to the electron velocity at the time they reach the wafer surface 23a. During this movement, the electrons 22a collide with the positive charges 28 and neutralize the positive charges 28.

Since the electrons 22a move in a cycloid movement on the wafer surface 23a, the possibility of collision of the electrons 22a with the positive charges 28 is increased, and the positive charges 28 remaining on the wafer surface 23a are neutralized.

In the ion implanter disclosed in the above mentioned Japanese Published Patent Application 1-232653, the possibility of collisions of the electrons and ions is increased compared with a conventional device without bar magnets shown in FIG. 1, so that the electrostatic charge is decreased.

However, when electrons are not supplied from an electron generating apparatus and the sample 2 is an insulating body or an insulating material covers most of the surface of the sample, the rate of generation of the secondary electrons is lower than 1. Consequently, the effect of decreasing the charges by neutralization of ions with electrons can hardly be expected.

Even if electrons are supplied, there are many magnetic lines of force near the center and at the inner side of the outer periphery of the sample wafer surface, but few magnetic line of force exist on the outside of the outer periphery, since the magnets 26 are in the holder 25, as shown in FIGS. 3A and 3B. Due to the magnetic lines of force 27, the electrons reaching the wafer surface 23a move in a cycloid movement around the magnetic lines of force 27, collide with the positive ions and neutralize the positive ions. However, since there are few magnetic lines of force 27 trapping electrons not reaching the wafer surface 23a and the secondary electrons generated in the holder 25 near the outer periphery of the wafer 23, these electrons can not be effectively used for neutralizing the positive ions.

SUMMARY OF THE INVENTION

An object of the present invention is to provide an ion implanter of preventing electrostatic discharge damage caused by charge potential, by effectively trapping secondary electrons generated from a sample or sample table around the sample when an ion beam is applied to the sample, with magnetic lines of force, transferring the electrons to the central portion of the sample to increase the chances of recombination with positive ions applied to the sample thereby reducing the electrostatic charge on the surface of the sample.

The ion implanter in accordance with the present invention comprises a sample table on which a sample is placed, and means for injecting ions into a sample placed on the sample table. The ion implanter comprises magnetic field applying means for generating a radial magnetic field on the surface of the sample extending from near the center of the sample to the outside of the outer periphery thereof.

In the ion implanter having such structure, supplied electrons or secondary electrons generated when the ion beam irradiates the sample table or the sample, including the secondary electrons generated from the sample table near the outer periphery of the sample can be effectively trapped in the magnetic field. The trapped electrons are transferred to the central portion of the sample, attracted by the electrostatic charge of the ions applied to the surface of the sample and recombined with these ions, and as a result, the electrostatic charge of the sample surface is lowered.

More specifically, the magnetic field applying means of the ion implanter of the present invention may be formed of a plurality of permanent magnets arranged behind the sample. In this case, the plurality of permanent magnets are arranged radially with the magnetic poles of one polarity all positioned near the center of the sample, while the magnetic poles of the other polarity are all positioned behind the outer side of the outer periphery of the sample.

A bar magnet or a magnet having square shape with one side opened may be used as the permanent magnet, provided that a magnetic pole end is embedded in the sample table behind and near the sample.

In another aspect, the magnetic field applying means of the ion implanter in accordance with the present invention may be formed of a plurality of electromagnets arranged behind the sample. In this case, the plurality of electromagnets are arranged radially with the magnetic poles of one polarity all positioned near the center of the sample, and magnetic poles of the other polarity all positioned behind the outside of the outer periphery of the sample. In this case, a yoke of an electromagnet may be a bar which is entirely embedded in the sample table, or it may have a square shape with one side opened, with only a portion near the magnetic pole embedded in the sample table.

If the yoke has a square shape with one side opened, a central portion between the magnetic poles may be positioned outside of the sample table, with electromagnetic coils wrapped around the portion outside the sample table.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
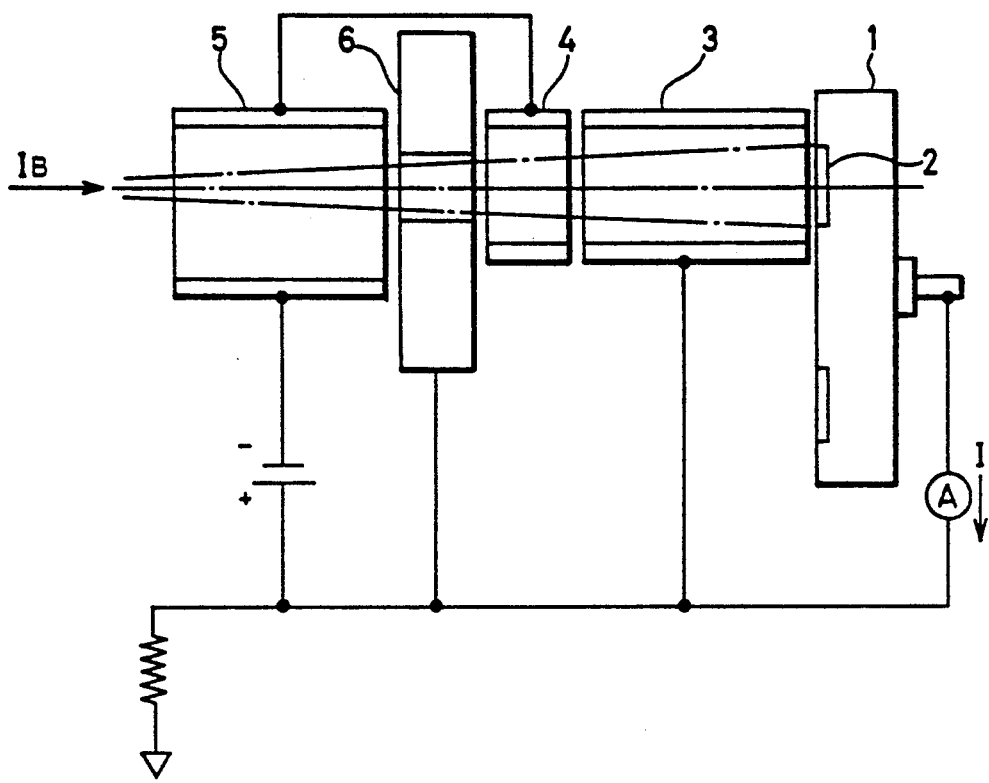
FIG. 1 is a cross sectional view of a main portion of a conventional ion implanter.
Figure 2:
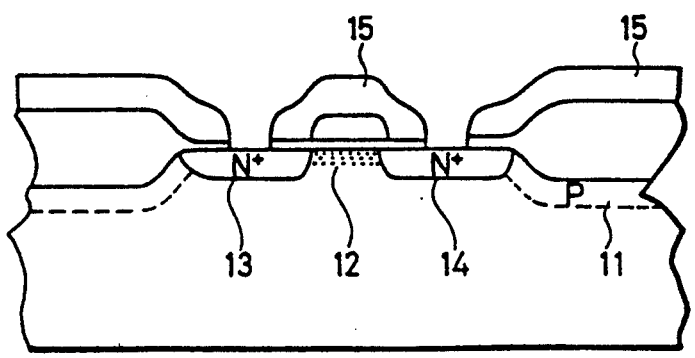
FIG. 2 is a schematic cross sectional view showing a MOS transistor formed by using an ion implanter.
Figure 3A:
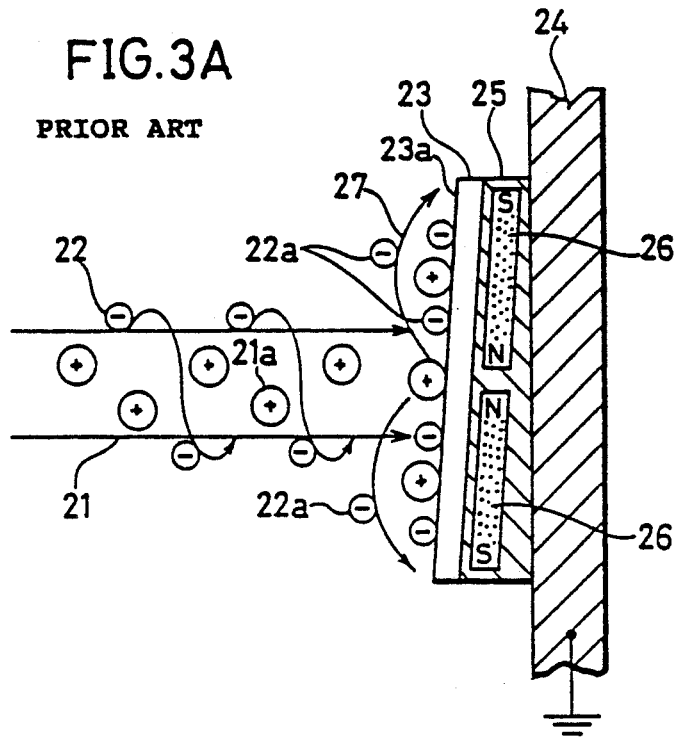
FIG. 3A is a cross sectional side view showing a sample table of a conventional ion implanter solving part of the problem of the conventional ion implanter shown in FIG. 1.
Figure 3B:
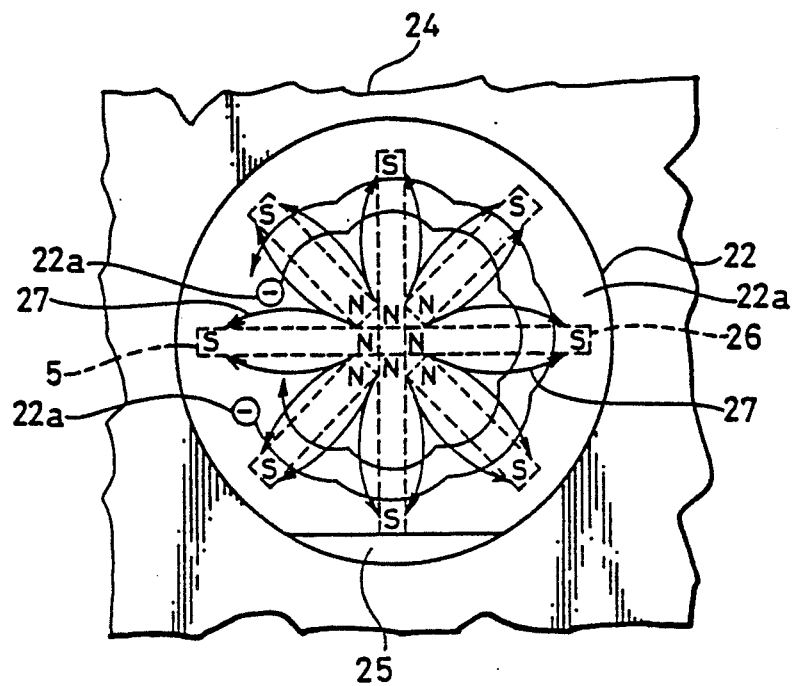
FIG. 3B shows the apparatus of FIG. 3A viewed from the left side of FIG. 3A.
Figure 4A:
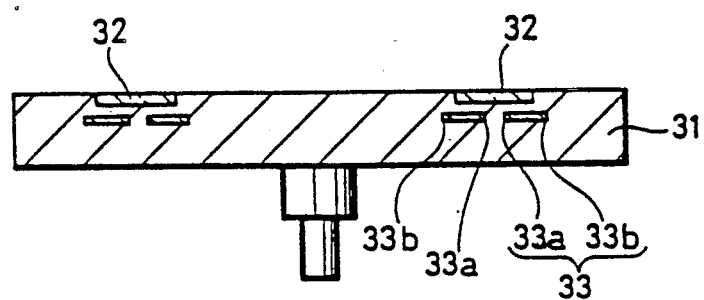
FIG. 4A is a cross sectional view showing a sample table of an ion implanter in accordance with one embodiment of the present invention.
Figure 4B:
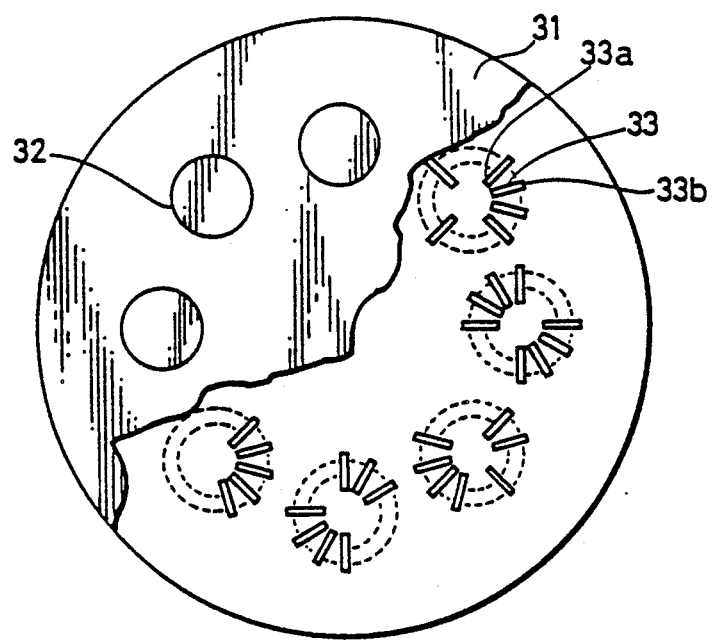
FIG. 4B is a partially broken away plan view thereof.
Figure 5A:
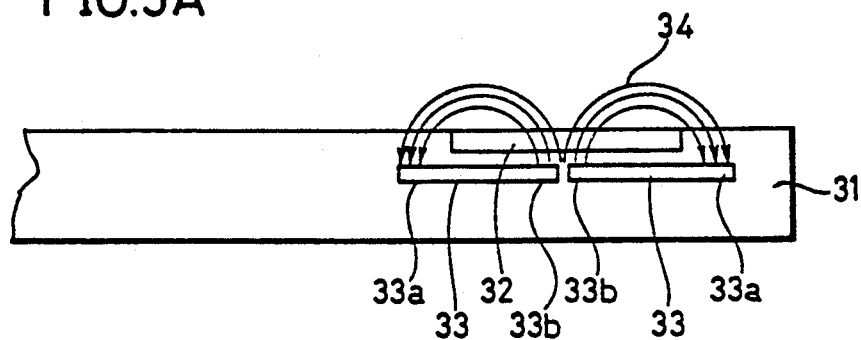
FIG. 5A is a partial enlarged side view of the sample table of FIG. 4A.
Figure 5B:
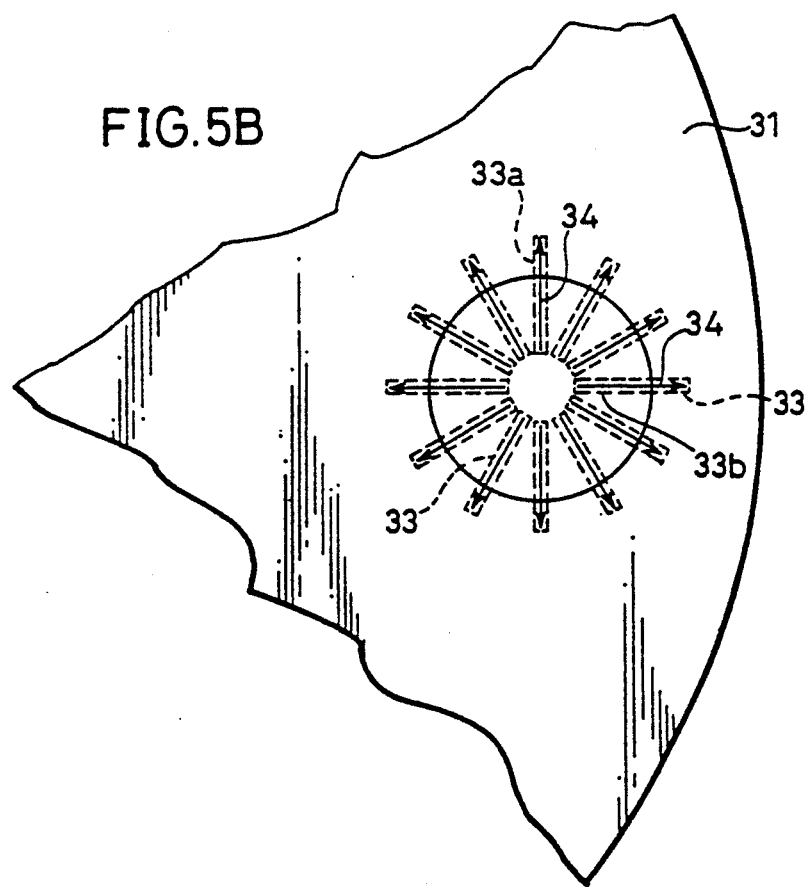
FIG. 5B is a partial enlarged plan view of the same sample table.
Figure 6:
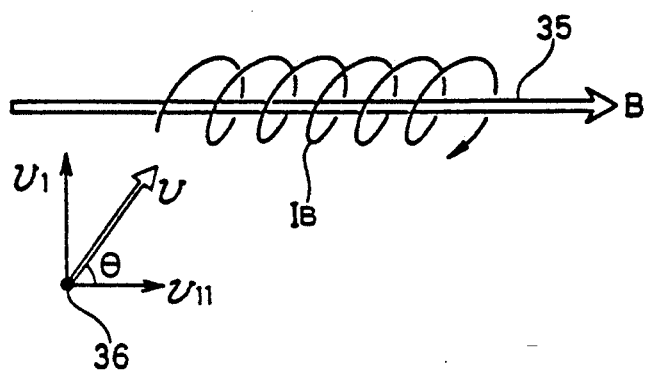
FIG. 6 shows the behavior of electrons relative to magnetic lines of force.

One embodiment of the present invention will be described with reference to FIGS. 4A-5B. FIG. 4A is a sectional side view near a sample table of an ion implanter according to one embodiment of the present invention. FIG. 4B is a plan view of the ion implanter table shown in FIG. 4A. Referring to FIGS. 4A and 4B, in the ion implanter of the present embodiment, samples 32 are held on a sample table 31. A plurality of bar magnets 33 are embedded in the sample table 31 behind the samples 32. The bar magnets 33 are arranged radially with N poles 33a positioned near the central portion of the samples 32 and S poles 33b positioned outside the outer periphery of a respective sample 32. Radial magnetic fields lie between the N poles 33a and S poles 33b of the bar magnets 33. As shown in FIGS. 5A and 5B, in the magnetic fields, some of the magnetic lines of force 34 lie on the surface and near the surface of the samples 32. When an ion beam irradiate the sample table 31 or samples 32, secondary electrons are generated from the sample table 31 and the samples 32. The energy of the secondary electron is about several tens of eV at the largest and are emitted from the sample table 31 and from the samples 32 in every angle. The generated secondary electrons are trapped by the magnetic lines of force 34 on the surfaces and near the surfaces of the sample table 31 and the samples 32. As shown in FIG. 6, when an electron 36 having the speed V enters the magnetic field 35 having a magnetic flux density of V at an arbitrary angle ($\theta$), the electron is subjected to a force of $F = q \cdot V \times V$, where q represents charge of the electron. Unless the incident angle ($\theta$) is 90° C., the electron 36 begins helically rotating around the magnetic field 35. If there is no magnetic field 35, the electrons 36 scatter in every direction. However, since there is a magnetic field 36, the electrons 36 are trapped by the magnetic field as described above. The direction of the helical motion is in the same direction as the magnetic field as shown in FIG. 6 or in the reverse direction, dependent on the incident angle. Since the secondary electrons are emitted in every direction and not in a specified direction, about half of the secondary electrons proceed in a helical motion in the same direction as the magnetic field, and the remaining half of the electrons move in a helical motion in a direction reverse to that of the magnetic field.

Figure 7:
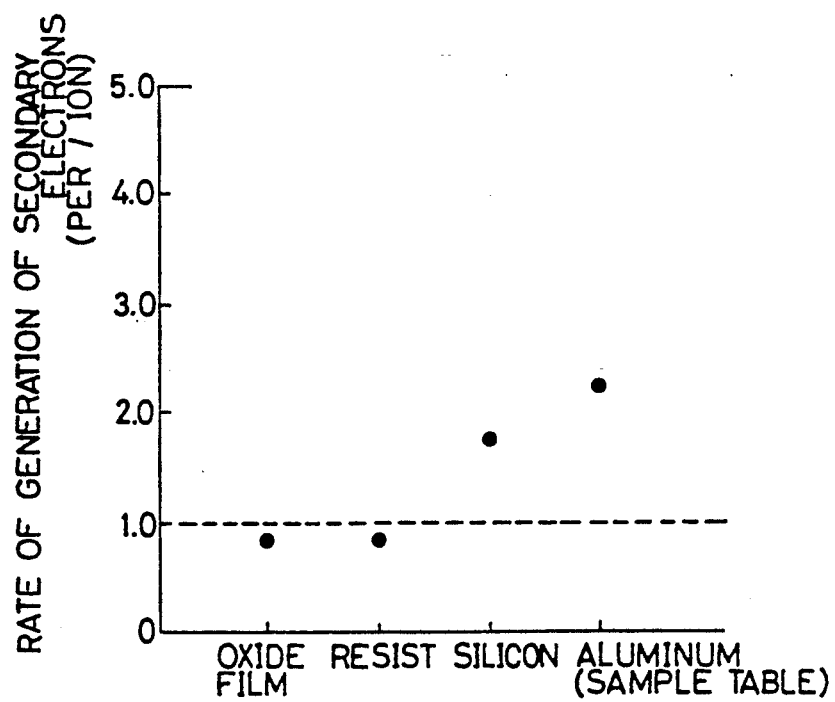
FIG. 7 is a graph showing the rate of generation of secondary electron for various materials.

If the sample 32 is an insulating material or if the surface of the sample 32 is covered with a material such as a resist, the number of secondary electrons generated per injected ion is smaller than 1, as shown in the graph of FIG. 7. Therefore, the sample is positively charged. If the sample 32 is formed of metal such as aluminum, the number of secondary electrons generated per injected ion is larger than 2, as is apparent from the graph of a FIG. 7. Therefore, more secondary electrons are generated from the sample table 31 than the sample 32, and these secondary electrons are emitted upward from the sample table 31 and from the sample 32 at every angle with energies of several ten eV at the largest. Therefore, if the secondary electrons generated from the sample table 31 can be effectively transferred to the surface of the sample 32, they can be effectively used to neutralize the injected ions. If the magnetic fields are as shown in FIGS. 5A and 5B, about half of the secondary electrons generated from the sample table 31 are transferred to the central portion of the sample 32. The transferred secondary electrons are attracted by the electrostatic charge caused by the ions injected to the surfaces of the samples, and they recombine with the ions or they lie on the surface to decrease the electrostatic charge. Therefore, generation of defects in the devices in the process of ion implantation derived from damage to the insulating materials caused by an electrostatic charge can be reduced.

Although N poles 33a are arranged near the central portion of the samples 32 and the S poles 33b are positioned outside of the outer peripheries of the sample 32 in the above embodiment, the positions of the N poles and S poles may be reversed.

Although bar magnets 33 are embedded in the sample table 31 and the magnets are arranged behind all the samples 32 in the above described embodiment, it is not necessary to embed the bar magnets 33 entirely in the sample table 31. More specifically, the magnets may be arranged such that a portion thereof is outside of the sample table 31 and positioned behind the sample, 32. The magnets are not limited to the bar magnets. Other permanent magnets and electromagnets provide the same effect as will be described for the following embodiments.

Figure 8:
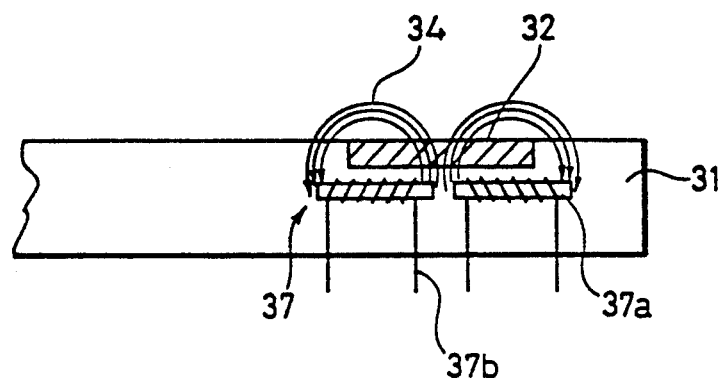
FIG. 8 is a partial enlarged sectional side view of a sample table of the ion implanter in accordance with another embodiment of the present invention.

FIG. 8 shows another embodiment of the present invention. In this embodiment, electromagnets 37 are used as the magnetic field applying means for generating magnetic lines of force 34 on the surface of the sample table 31. The electromagnet 37 has its bar shaped yoke 37a embedded behind a sample 32 in the sample table 31, like the bar magnets 33 in the above embodiment. An electromagnet coil 37b is wound around the bar shaped yoke 37a, and linear magnetic lines of force 34 are generated when current flows through the coils 37b.

Figure 9:
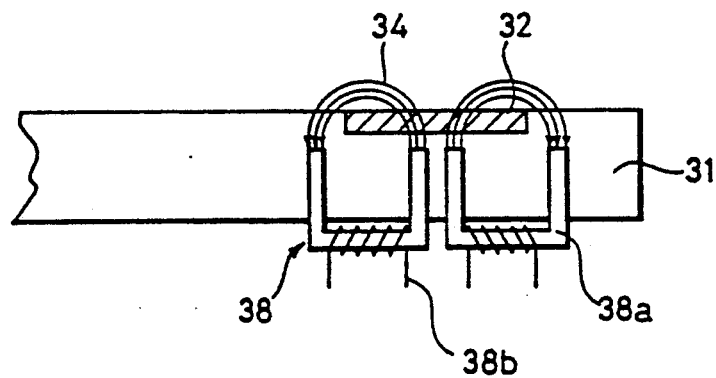
FIG. 9 is a partial enlarged cross sectional side view of a sample table of the ion implanter in accordance with a further embodiment of the present invention.

FIG. 9 shows a further embodiment of the present invention. In this embodiment, electromagnets 38 are used as the magnetic field applying means, with a portion thereof disposed outside of the sample table 31. In this embodiment, magnetic pole portions of a one-side-opened square shaped, i.e. U-shaped, yoke 38a of the electromagnetic 38 is embedded in the sample table 31 and positioned behind a sample 32. Electromagnetic coils 38b are wound around portions of the yoke 38a positioned outside of the sample table 31. Radial magnetic lines of force 34 are generated on the surface of the sample table 31 when a current flows through the electromagnetic coil 38b.

The same effect as in the embodiment shown in FIG. 4A is provided by the embodiment shown in FIGS. 8 and 9.

Although the present invention has been described and illustrated in detail, it is clearly understood that the same is by way of illustration and example only and is not to be taken by way of limitation, the scope of the present invention being limited only by the terms of the appended claims.

What is claimed is:

1. An ion implanter including:
   a sample table on which a sample having a surface a center, and an outer periphery is placed;
   means for injecting ions by applying an ion beam to the surface of a sample on the sample table; and
   magnetic field applying means for generating a radial magnetic field at the surface of said sample, the magnetic field extending from near the center of said sample beyond the outer periphery of said sample.

2. An ion implanter according to claim 1 wherein said magnetic field applying means comprises a plurality of permanent magnets, each having magnetic poles of opposite polarity and disposed behind the sample relative to the ion beam, said plurality of permanent magnets being radially disposed with respect to the sample, the magnetic poles of one polarity all being positioned near the center of the sample and the magnetic poles of the other polarity all being positioned beyond the outer periphery of the sample.

3. An ion implanter according to claim 2, wherein each of said permanent magnets is a bar magnet having opposed ends and a magnetic pole on each end embedded entirely in the sample table.

4. An ion implanter according to claim 2, wherein each of said permanent magnets has a U shape and is embedded in the sample table.

5. An ion implanter according to claim 1 wherein said magnetic field applying means comprises a plurality of electromagnets, each having magnetic poles of opposite polarity and disposed behind the sample relative to the ion beam, said plurality of electromagnets being radially disposed with respect o the sample, the magnetic poles of one polarity all being positioned near the center of the sample and the magnetic poles of the other polarity all being positioned beyond the outer periphery of the sample.

6. An ion implanter according to claim 5, wherein said magnetic field applying means comprises bar-shaped yokes disposed radially with respect to the sample and electromagnetic coils wound around the yokes in the sample table beyond the sample.

7. An ion implanter according to claim 5, wherein each of said electromagnets comprises a yoke having a U shape and an electromagnetic coil wound around said yoke and said yoke is embedded in said sample table behind the sample.

8. An ion implanter according to claim 7, wherein
   a central portion connecting magnetic poles of said yoke is positioned outside of said sample table, said electromagnetic coil wound around that portion positioned outside of the sample table.

* * * * *